United States Patent
Kim et al.

(10) Patent No.: US 7,551,451 B2
(45) Date of Patent: *Jun. 23, 2009

(54) PLASMA DISPLAY MODULE

(75) Inventors: Sok-San Kim, Suwon-si (KR);
Tae-Kyoung Kang, Suwon-si (KR);
Ki-Jung Kim, Suwon-si (KR);
Myoung-Kon Kim, Suwon-si (KR);
Won-Sung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 159 days.

This patent is subject to a terminal disclaimer.

(21) Appl. No.: 11/413,006

(22) Filed: Apr. 28, 2006

(65) Prior Publication Data

US 2006/0245171 A1    Nov. 2, 2006

(30) Foreign Application Priority Data

Apr. 29, 2005  (KR) ............... 10-2005-0036022

(51) Int. Cl.
*H05K 5/00* (2006.01)

(52) U.S. Cl. .................. 361/752; 361/200; 361/681

(58) Field of Classification Search ........... 361/752, 361/200, 681; 313/36, 46; 349/158
See application file for complete search history.

(56) References Cited

U.S. PATENT DOCUMENTS

| | | | | |
|---|---|---|---|---|
| 5,771,085 A | * | 6/1998 | Ochi et al. | 349/158 |
| 5,850,276 A | * | 12/1998 | Ochi et al. | 349/158 |
| 6,061,231 A | | 5/2000 | Crockett | |
| 6,498,718 B1 | | 12/2002 | Kim et al. | |
| 7,323,808 B2 | * | 1/2008 | Kim et al. | 313/44 |
| 2001/0039744 A1 | * | 11/2001 | Wu et al. | 33/645 |
| 2005/0078430 A1 | * | 4/2005 | Kim et al. | 361/200 |
| 2006/0082272 A1 | * | 4/2006 | Kim et al. | 313/46 |
| 2006/0158074 A1 | * | 7/2006 | Kang et al. | 313/36 |

FOREIGN PATENT DOCUMENTS

| | | |
|---|---|---|
| JP | 60-021774 U | 2/1985 |
| JP | 62-180854 U | 11/1987 |
| JP | 06-267435 A | 9/1994 |
| JP | 07-084671 A | 3/1995 |
| JP | 2000-132279 A | 5/2000 |
| JP | 2001-222234 A | 8/2001 |
| JP | 2002-162913 A | 6/2002 |
| JP | 2002-367523 A | 12/2002 |
| KR | 10-2005-0034321 A | 4/2005 |

* cited by examiner

*Primary Examiner*—Dean A. Reichard
*Assistant Examiner*—Xiaoliang Chen
(74) *Attorney, Agent, or Firm*—Lee & Morse, P.C.

(57) ABSTRACT

A plasma display module including a plasma display panel (PDP) including a first substrate and a second substrate and having an alignment mark formed thereon, and a chassis supporting the PDP and having an alignment mark corresponding to the alignment mark of the PDP.

18 Claims, 5 Drawing Sheets

PLASMA DISPLAY MODULE

BACKGROUND OF THE INVENTION

1. Field of the Invention

The present invention relates to a plasma display module. More particularly, the present invention relates to a plasma display module having a plasma display panel (PDP) and a chassis, wherein the PDP and the chassis include provisions for accurate alignment.

2. Description of the Related Art

A plasma display module, which is a flat display module, forms an image using an electrical gas discharge. Since plasma display modules can be made thin and implemented as large screens having high visual quality and large viewing angles, they are widely used.

A typical plasma display module may include a PDP having a first substrate and a second substrate, a chassis supporting the PDP, and a driving circuit unit generating an electrical signal for driving the PDP.

A first display region may be located at the center of the first substrate, and a second display region may be formed at the center of the second substrate. The first and second display regions may be integrated into a display unit.

The display unit forms the image using the electrical gas discharge. The display unit may include discharge cells in which the discharge occurs, barrier ribs defining the discharge cells, a phosphor layer spread inside the discharge cells, a variety of electrodes to which voltages are applied for generating the discharge, and a dielectric layer covering the electrodes.

Alignment marks may be used to align the first and second substrates. Protruding alignment marks may be formed outside the first display region. Alignment marks in the form of alignment holes, corresponding to the protruding alignment marks, may be formed outside the second display region.

In a conventional alignment method, the first and second substrates may be aligned by checking the protruding alignment marks through the alignment holes using a camera or the naked eye. However, the chassis is aligned with, and attached to, the PDP using the naked eye, not a camera. As a result, the chassis may be poorly aligned with the PDP.

The chassis may support the PDP and prevent it from being deformed or damaged. Accordingly, the chassis must be sufficiently strong. Therefore, the plasma display module may include a reinforcing member to reinforce the chassis. The reinforcing member may also facilitate the installation of the driving circuit on the chassis. More than one reinforcing member may be required, however, and thus the number of parts and processes required increases, which, in turn, sharply increases manufacturing costs of the plasma display module.

SUMMARY OF THE INVENTION

The present invention is therefore directed to a plasma display module, which substantially overcomes one or more of the problems due to the limitations and disadvantages of the related art.

It is therefore a feature of an embodiment of the present invention to provide a plasma display module having a structure that provides for accurate alignment of a PDP and a chassis, the plasma display module having alignment marks on the chassis and the PDP, respectively, wherein the alignment marks are matched to each other.

It is therefore another feature of an embodiment of the present invention to provide a plasma display module which allows for easy automation of an alignment process for a PDP and a chassis.

It is therefore yet another feature of an embodiment of the present invention to provide a plasma display module that includes a reinforced dual-structured chassis, which may eliminate the need for a reinforcing member and reducing manufacturing costs.

At least one of the above and other features and advantages of the present invention may be realized by providing a plasma display module including a plasma display panel (PDP) including a first substrate and a second substrate and having a PDP alignment mark formed therein, and a chassis supporting the PDP and having a chassis alignment mark corresponding to the PDP alignment mark.

The PDP alignment mark may be formed in the first substrate or the second substrate. A display area for displaying an image may be formed between the first substrate and the second substrate, and the PDP alignment mark may be formed in the first substrate outside the display area. The PDP may include a plurality of PDP alignment marks, and the plurality of PDP alignment marks may be formed adjacent to two corners of the display which are diagonal to each other. The PDP may include a plurality of PDP alignment marks, and the plurality of PDP alignment marks may be formed adjacent to four corners of the display.

The PDP may include a first PDP alignment mark formed in the first substrate and a second PDP alignment mark formed in the second substrate. The second PDP alignment mark may be formed at a position corresponding to that of the first PDP alignment mark. The first PDP alignment mark may be a protrusion and the second PDP alignment mark may be a hole.

A plurality of second PDP alignment marks may be formed on the second substrate, and at least one second PDP alignment mark is formed at a position in the second substrate that does not correspond to a position of a first PDP alignment mark in the first substrate. The second PDP alignment mark may be formed at a position corresponding to that of the chassis alignment mark. The first PDP alignment mark and the chassis alignment mark may be holes, the second PDP alignment mark may protrude from two faces of the second substrate, and the second PDP alignment mark may be inserted into the first PDP alignment mark and third chassis alignment mark. The first PDP alignment mark and the chassis alignment mark may be coaxial. The chassis may include a first chassis unit and a second chassis unit, chassis alignment marks may be formed in the first chassis unit and the second chassis unit, and second PDP alignment marks may be inserted into the chassis alignment marks in the first chassis unit but may not be inserted into the chassis alignment marks in the second chassis unit. The plasma display module may further include at least one second PDP alignment mark formed in the second substrate at a position that does not correspond to a position of a first PDP alignment mark formed in the first substrate and that is aligned with chassis alignment marks formed in the first and second chassis units.

The chassis may include a first chassis unit and a second chassis unit. The second chassis unit may be thicker than the first chassis unit. The PDP alignment mark may be a hole or a protrusion. The chassis alignment mark may be a hole. A region around the chassis alignment mark may include a material having low optical reflectivity. The chassis may include a material having low optical reflectivity. A region around the third alignment mark may include a black material. The chassis may include a black material.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
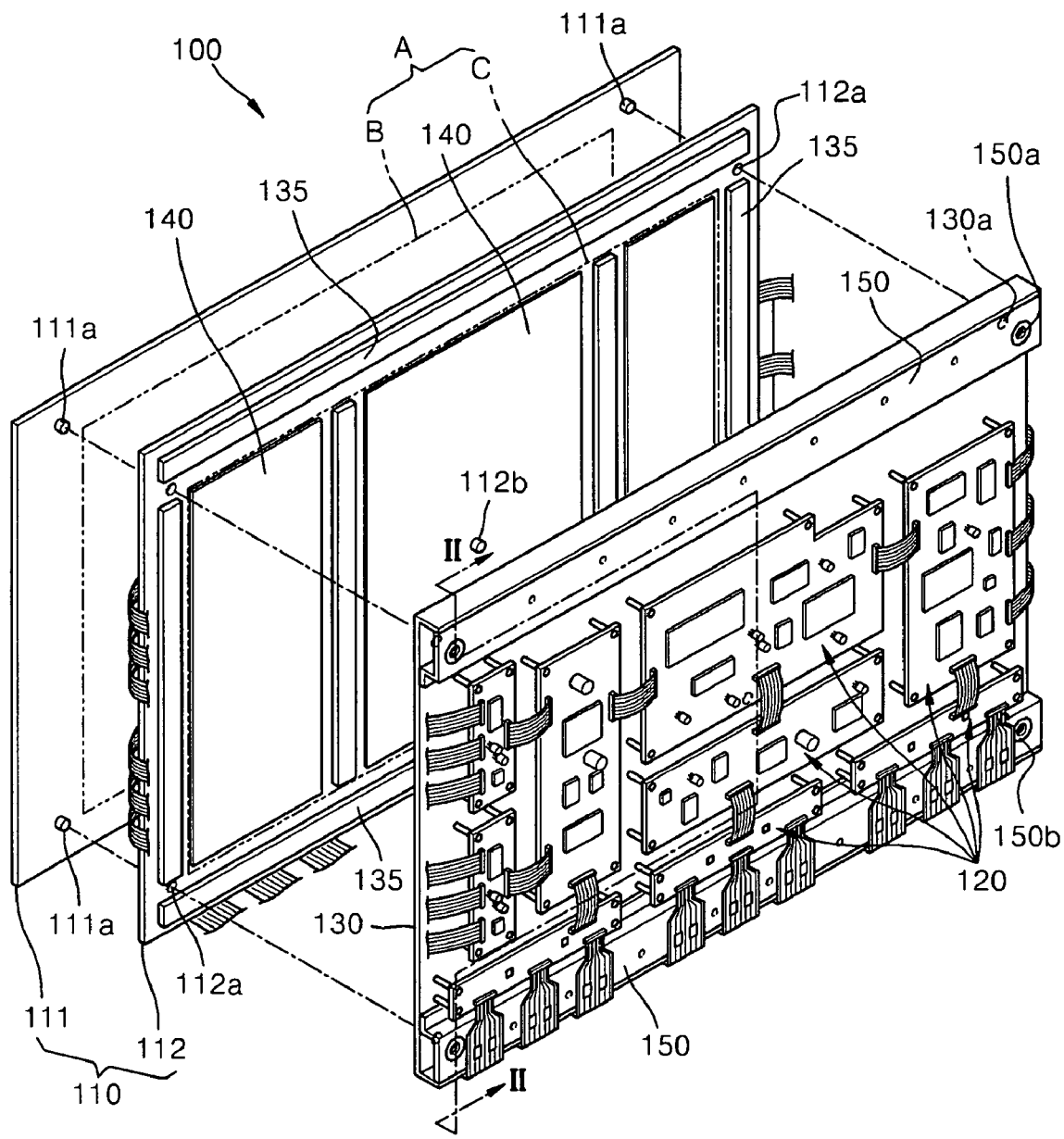
FIG. 1 illustrates a perspective view of a plasma display module according to a first embodiment of the present invention.

Korean Patent Application No. 10-2005-0036022, filed on Apr. 29, 2005, in the Korean Intellectual Property Office, and entitled: "Plasma Display Module," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
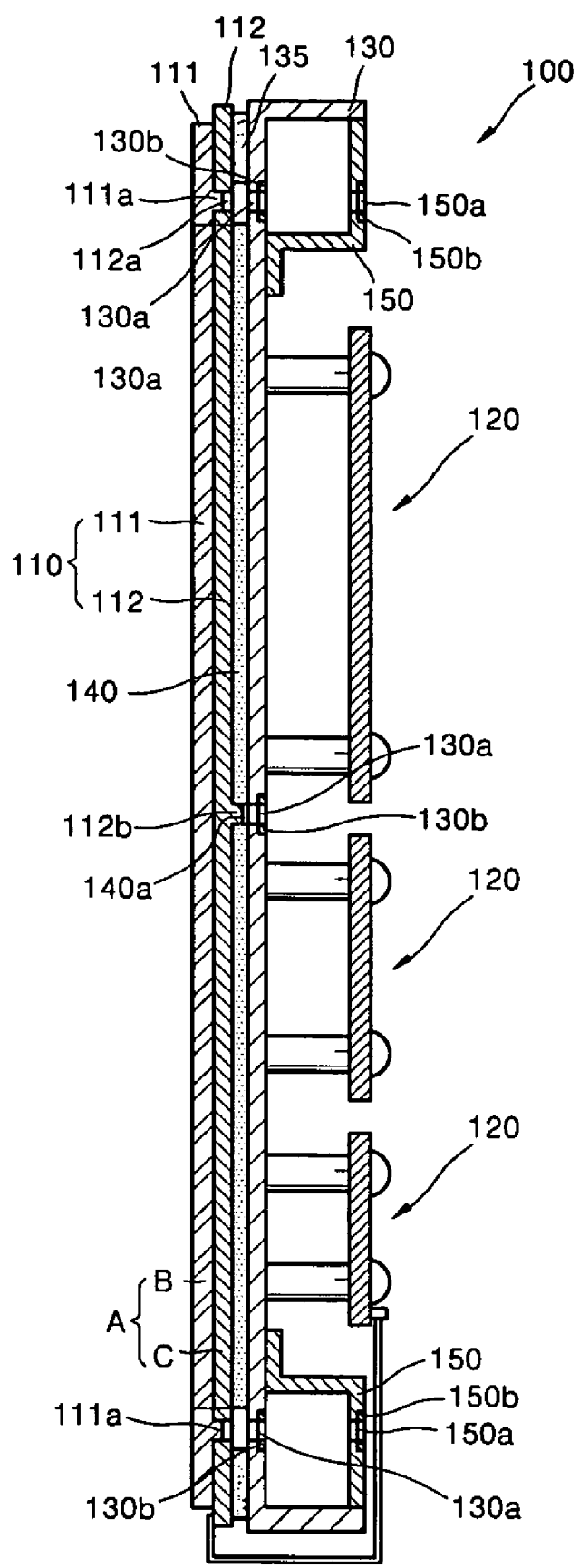
FIG. 2 illustrates a cross-sectional view taken along a line II-II of FIG. 1.
Figure 3:
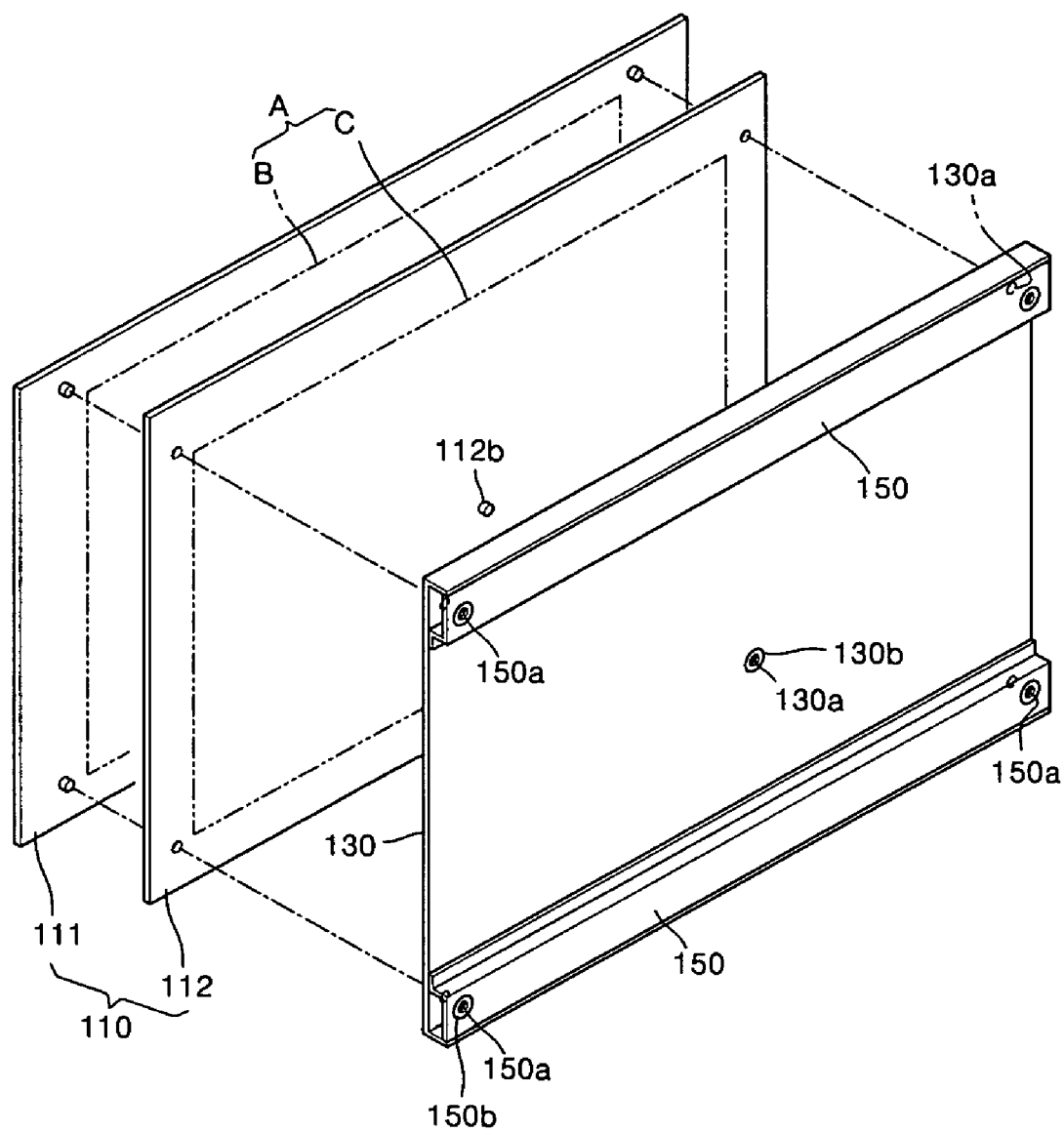
FIG. 3 illustrates a partially exploded perspective view showing the shape and disposition of alignment marks formed on a PDP and a chassis illustrated in FIG. 1.

FIG. 1 illustrates a perspective view of a plasma display module according to a first embodiment of the present invention, FIG. 2 illustrates a cross-sectional view taken along a line II-II of FIG. 1 and FIG. 3 illustrates a partially exploded perspective view showing the shape and disposition of alignment marks formed on a PDP and a chassis illustrated in FIG. 1. Referring to FIGS. 1 through 3, a plasma display module 100 may include a PDP 110 for displaying an image. The PDP 110 may include a first substrate 111 and a second substrate 112. The PDP 110 may be, e.g., an alternating current (AC) 3-electrode surface discharge type PDP. The PDP 110 may include a display unit A for displaying an image, the display unit A having a first display region B and a second display region C.

The first display region B and the second display region C may be formed on the first and second substrates 111, 112, respectively. However, the present invention is not limited thereto. The display unit A may be interposed between the first substrate 111 and the second substrate 112. In addition, the display unit A may be formed between the first and second substrates 111, 112 using a thick film ceramic sheet (TFCS) method. The TFCS method is a technology for forming a desired high-quality pattern by performing foaming, printing and drying processes on a ceramic substrate, as set forth in the publication "$10^{th}$ International Display Workshop 2003," at pages 897-900.

The first display region B may be formed at the center of the first substrate 111. The first display region B may include a plurality of sustain electrode pairs, composed of common electrodes and scan electrodes, which may be formed in a striped pattern on the first substrate 111 (not shown). The first display region B may also include a first dielectric layer covering the sustain electrode pairs, and a protective layer coated on the first dielectric layer (not shown).

The second substrate 112 may face the first substrate 111, and the second display region C may be formed at the center of the second substrate 112. The second display region C may include a plurality of address electrodes, a second dielectric layer, barrier ribs, and red (R), green (G) and blue (B) phosphor layers (not shown). The second dielectric layer may cover the address electrodes. The address electrodes may cross the sustain electrode pairs on the first substrate 111. The barrier ribs define discharge cells in which the gas discharge occurs, and block crosstalk between adjacent discharge cells. The RGB phosphor layers may be spread inside the discharge cells defined by the barrier ribs.

The address electrodes may cross the discharge cells and extend to an end or both ends of the pair of first and second substrates 111, 112. The address electrodes may serve to generate an address discharge, i.e., to select the discharge cells in which the gas discharge will occur.

The discharge cells may each correspond to regions where the sustain electrode pairs and the address electrodes cross each other, and may be filled with the discharge gas.

A chassis 130 may be disposed at a back side of the PDP 110. The chassis 130 may prevent the PDP 110 from being deformed by heat or damaged by an external impact. The chassis 130 may also help dissipate heat, which is conducted from the PDP 110, thereby preventing the temperature of the PDP 110 from rising above an appropriate level.

As described above, the chassis 130 may support the PDP 110 and prevent the PDP 110 from being deformed or damaged. Accordingly, the chassis 130 must be sufficiently strong. To reinforce the chassis 130 and to facilitate the disposition of a driving circuit unit 120 on the chassis 130, the plasma display module 100 may include reinforcing members 150 disposed at the back side of the chassis 130, i.e., on the side opposite from the PDP 110.

The driving circuit unit 120 may generate electrical signals for driving the address electrodes, and may be installed on a surface of the chassis 130, opposite from the PDP 110. The driving circuit unit 120 may include various electronic parts (not shown) to supply power and to transmit voltage signals for displaying an image.

One or more alignment marks may be formed in the plasma display module. According to this embodiment of the present invention, one or more of first alignment marks 111a, second alignment marks 112a and 112b, and third alignment marks 130a may be formed in the PDP 110 and the chassis 130, respectively.

A camera (not shown) or similar optical sensor may be used to recognize each of, or any one of, the first, second and third alignment marks 111a, 112a, 112b and 130a. The PDP 110 may be aligned with the chassis 130 using an alignment apparatus (separately provided; not shown), based on information transmitted from the camera. The PDP 110 may also be aligned with the chassis 130, or the proper alignment of the same may be checked, using the naked eye instead of the camera.

The PDP 110 may be matched with the chassis 130 using the alignment apparatus to match corresponding alignment marks. For example, if two corresponding alignment marks are respectively shaped like a protrusion and a hole, the alignment apparatus may align and/or insert the protrusion into the hole.

The first alignment marks 111a and the second alignment marks 112a and 112b may be formed in the PDP 110. In particular, the first alignment marks 111a may be formed in the first substrate 111, and the second alignment marks 112a and 112b may be formed in the second substrate 112. The first and second substrates 111 and 112 may be aligned using the alignment marks 111a and 112a.

The first alignment marks 111a may be formed outside the first display region B of the first substrate 111 so that the first alignment marks 111a do not block visible light emitted from the display unit A of the PDP 110, which would deteriorate image quality.

The first alignment marks 111a may be disposed adjacent to two diagonally-opposed corners of the first display region B. This may provide for enhanced alignment precision, particularly when only two first alignment marks 111a are employed, as alignment precision may be easier to achieve when alignment marks are disposed farther away from each other. However, the present invention is not limited to this implementation, and various numbers of the first alignment marks 111a may be disposed in various areas of the first substrate 111.

In an implementation, the first alignment marks 111a may be disposed adjacent to four corners of the first display region B. This may provide for enhanced alignment precision, as alignment precision may be easier to achieve when the number of the first alignment marks 111a is increased.

The first alignment marks 111a may be protrusions, e.g., round or cylindrical protrusions. However, the present invention is not limited thereto, and the first alignment marks 111a may be, e.g., square, cross-shaped or any other suitable shape. In addition, the first alignment marks 111a may be, e.g., grooves or predetermined patterns. The first alignment marks 111a may be formed on both surfaces of the first substrate 111.

The second alignment marks 112a may be formed in the second substrate 112 to correspond to the first alignment marks 11a. The first alignment marks 111a and the second alignment marks 112a may be formed such that the first and second substrates 111, 112 are aligned when the first alignment marks 111a and the second alignment marks 112a are aligned.

In an implementation, the first and second alignment marks 111a, 112a may be differently shaped. The shapes of the first and second alignment marks 111a, 112a may be selected such that, when the first and second alignment marks 111, 112a are precisely aligned, the two different shapes of the first and second alignment marks 111a, 112a may be integrated into a new shape, e.g., a more elaborate shape.

In another implementation, the first or second alignment marks 111a, 112a may be formed as holes. For example, the second alignment marks 112a may be protrusions and first alignment marks 111a may be holes. Therefore, the protruded shape of the second alignment marks 112a may be viewed through the first alignment mark holes 111a. Alternatively, the first and second alignment marks 111a and 112a may be coupled to each other.

The second alignment marks 112a may be formed on a surface of the second substrate 112 facing the first substrate 111, or a surface of the second substrate 112 facing the chassis 130, or both surfaces of the second substrate 112. In another implementation, the second alignment marks 112a may be formed as holes penetrating both surfaces of the second substrate, as illustrated in FIGS. 1 through 3.

In addition to the second alignment marks 112a, at least one of the second alignment marks 112b may be formed on the rear surface of the second substrate 112, opposite to the second display region C of the second substrate 112, at a position that does not correspond to any of the first alignment marks 11a. In this case, it is assumed that the visible light is emitted to the outside through the first substrate 111, not the second substrate 112.

The second alignment mark 112b may have a protruded shape and may be formed on the surface of the second substrate 112 facing the chassis 130. In other implementations, the second alignment mark 112b may be, e.g., square, cross-shaped or any other suitable shape. In addition, the second alignment mark 112b may be, e.g., a groove or a predetermined pattern.

The second alignment mark 112b may be used to align components of the plasma display module 100 that are disposed to the rear of the PDP 110. Therefore, the number of alignment marks can be increased without blocking visible light emitted from the first and second display regions A, B of the PDP 110, which may further enhance alignment precision.

A heat conduction sheet 140 may be interposed between the second substrate 112 and the chassis 130. The heat conduction sheet 140 may include a cut-out or void at a position corresponding to the second alignment mark 112b, such that the second alignment mark 112b can be viewed by a camera or the naked eye. This may be a hole 140a formed at a position in the heat conduction sheet 140 corresponding to the second alignment mark 112b.

The third alignment marks 130a may be formed at positions in the chassis 130 corresponding to the second alignment marks 112a, 112b. When the second alignment marks 112a, 112b and the third alignment marks 130a are aligned, the PDP 110 and the chassis 130 are aligned accordingly. The disposition and alignment process of the third alignment marks 130a may be substantially similar to that of the first and second alignment marks 111a, 112a. Therefore, the details thereof will not be repeated.

The third alignment marks 130a may be round holes, as illustrated in FIGS. 1 through 3. However, the present invention is not limited thereto, and the third alignment marks 130a may be, e.g., square, cross-shaped or any other suitable shape. In addition, the third alignment marks 130a may be grooves or predetermined patterns.

As with the first alignment marks 111a, the disposition and shape of the second and third alignment marks 112a, 112b and 130a may be varied. Further, while the alignment marks 130a are shown aligned with both the first and second alignment marks 111a, 112a, the present invention is not limited to this arrangement. In particular, since the second substrate 112 is aligned with the first substrate 111 by the first and second alignment marks 111a, 112a, and since the alignment marks 112b do not block visible light emitted from the display unit A, any suitable configuration of the second alignment marks 112b may be used in connection with the third alignment marks 130a. That is, the third alignment marks 130a need not correspond to the first and second alignment marks 111a, 112a, and chassis 130 may be aligned to the PDP 110 without aligning the third alignment marks 130a to the first and second alignment marks 111a, 112a, by using one or more second alignment marks 112b with corresponding third alignment marks 130a.

A method of aligning the first substrate 111 with the second substrate 112, and aligning the PDP 110 with the chassis 130, using the first, second and third alignment marks 111a, 112a, 112b and 130a according to an embodiment of the present invention will now be described in detail.

The first and second substrates 111 and 112 may be positioned with respect to each other. In this case, the second substrate 112 may be positioned with respect to the first substrate 111 such that a surface of the second substrate 112 can be subsequently coupled to the first substrate 111, whereby the second substrate 112, when coupled to the first substrate 111, can fully perform its intended functions. To precisely align the first substrate 111 with the second substrate 112, the first substrate 111 or the second substrate 112 may be slowly moved using an alignment apparatus (not shown) until the first alignment marks 111a, e.g., protrusions, are coupled to the corresponding second alignment marks 112a, e.g., holes, or until the first alignment marks 111a can be fully viewed through the second alignment marks 112a using a camera or the naked eye. When the first alignment marks 111a can be fully viewed through the second alignment marks 112a, the first substrate 111 is precisely aligned with the second substrate 112.

The chassis 130 may be disposed on the second substrate 112 of the PDP 110 such that a surface of the chassis 130 can be subsequently coupled to the second substrate 112, whereby the chassis 130, when coupled to the second substrate 112, can fully perform its intended functions. To precisely align the PDP 110 with the chassis 130, the PDP 110 or the chassis 130 may be slowly moved using an alignment apparatus until the first alignment marks 111a, e.g., protrusions, can be fully viewed through the corresponding second and third alignment marks 112a, 130a, e.g., holes, by a camera or the naked eye.

At the same time, the alignment process is performed until the second alignment mark 12b, e.g., a protrusion, can be fully viewed through a corresponding third alignment mark 130a, e.g., a hole, and the hole 140a of the heat conduction sheet 140, by a camera or the naked eye.

In other words, when the first alignment marks 111a can be fully viewed through the second and third alignment marks 112a, 130a, and when the second alignment mark 112b can be fully viewed through the third alignment mark 130a and the hole 140a of the heat conduction sheet 140, the PDP 110 and the chassis 130 are precisely aligned.

Additionally, the chassis 130 may be aligned with the reinforcing members 150 by forming alignment marks 150a, e.g., holes, at positions in the reinforcing members 150 corresponding to the positions of some of the third alignment marks 130a.

As noted above, the PDP 110 may be aligned with the chassis 130 using an alignment apparatus (not shown). The alignment apparatus may include an optical sensor. The alignment apparatus may be installed behind the chassis 130 for the alignment process. Low optical reflectivity of the chassis 130 may be important for precise measurement. In particular, when the optical reflectivity of regions around the third alignment marks 130a of the chassis 130 or the holes 150a of the reinforcing members 150 is low, measurement errors may be reduced or prevented.

According to the present invention, the plasma display module 100 may further include coloration units 130b and 150b. The coloration units 130b and 150b may be formed by coloring the region around the third alignment marks 130a and the holes 150a of the reinforcing members 150 with a material having low optical reflectivity. The coloration units 130b and 150b may also be formed by coloring portions of the chassis 130 and the reinforcing members 150 with a material having low optical reflectivity, in order to reduce optical reflectivity. Alternatively, the coloration units 130b and 150b may be formed by coloring a region around elements, which are measured and aligned using an optical device, or by coloring the elements themselves using a material having low optical reflectivity.

Generally, the coloration units 130b and 150b may be formed of black materials, since black has low optical reflectivity. The coloration units 130b and 150b may be formed by spreading a black material, which may be a different material from that used for the chassis 130 or the reinforcing members 150, on the regions around the third alignment marks 130a and the holes 150a. Alternatively the chassis 130 and/or the reinforcing members 150 may be formed of the black material.

Other materials may also be used for the coloration units 130b and 150b, so long as they exhibit low optical reflectivity. For example, the coloration units 130b and 150b may be formed of a colored material, obtained by mixing black with another color or dark-colored material.

The coloration units 130b and 150 may be applied as needed with other implementations of the present invention.

Figure 4:
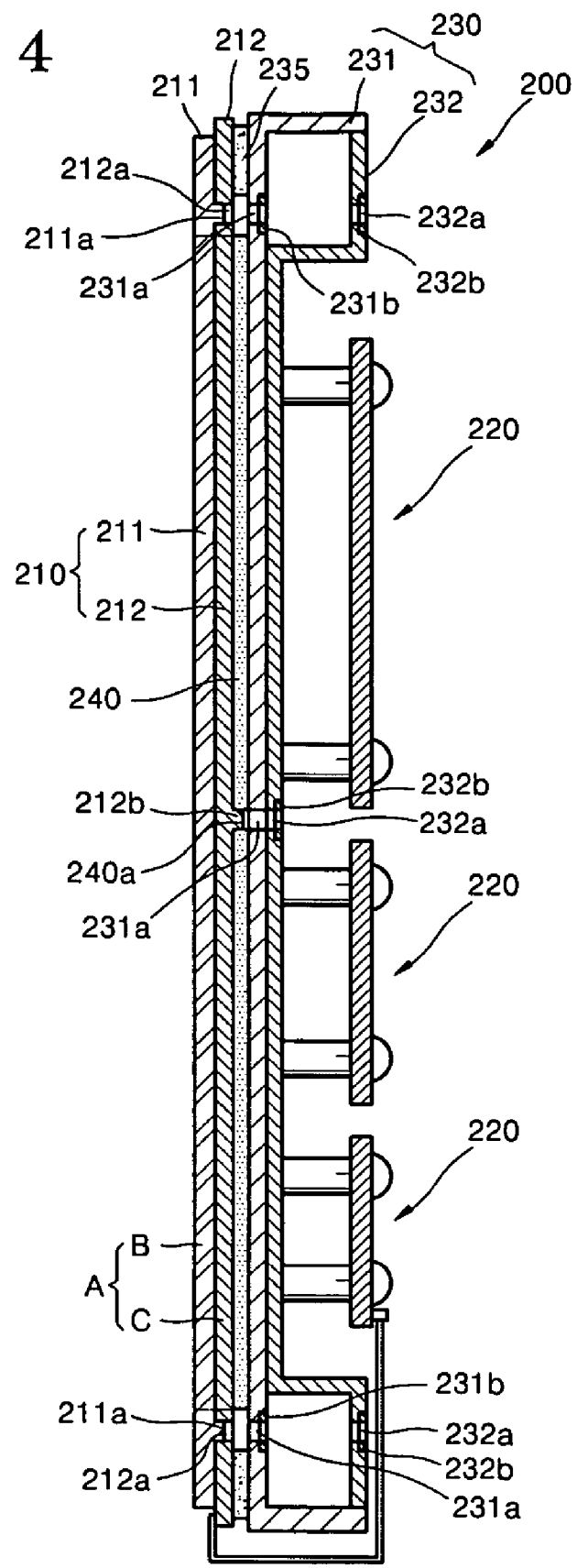
FIG. 4 illustrates a cross-sectional view of a plasma display module according to a second embodiment of the present invention, and corresponds to the cross-sectional view of the plasma display module of FIG. 2.

A plasma display module 200 according to a second embodiment of the present invention will now be described with reference to FIG. 4. FIG. 4 illustrates a cross-sectional view of a plasma display module according to the second embodiment of the present invention, and corresponds to the cross-sectional view of the plasma display module of FIG. 2.

The plasma display module 100 according to the first embodiment of the present invention includes the chassis 130 and the reinforcing members 150, as set forth above. The plasma display module 200 according to the second embodiment of the present invention includes a dual-structured chassis 230, which may include a first chassis unit 231 and a second chassis unit 232. An adhesive member 235, e.g., double sided adhesive tape, may be used to couple the PDP 210 to the chassis 230. Due to the structure of the dual-structured chassis 230, the plasma display module 200 may require fewer parts and assembly steps, which, in turn, may decrease the manufacturing costs of the plasma display module 200.

The second chassis unit 232 may be formed thicker than the first chassis unit 231, in order to reinforce the dual-structured chassis 230. However, the present invention is not limited thereto, and the second chassis unit 232 may be formed to have a thickness smaller or equal to that of the first chassis unit 231.

The plasma display module 200 according the second embodiment of the present invention also includes alignment marks to align a PDP 210 with the chassis 230. As in the first embodiment of the present invention, first alignment marks 211a and second alignment marks 212a, 212b may be formed in a first substrate 211 and a second substrate 212, respectively. Third alignment marks 231a, 232a may be formed in the first chassis unit 231 and the second chassis unit 232 of the chassis 230, respectively. The third alignment marks 231a, 232a illustrated in FIG. 4 are round holes. However, the present invention is not limited thereto, and the third alignment marks 231a, 232a may be, e.g., square, cross-shaped or any other suitable shape. In addition, the third alignment marks 231a and 232a may be, e.g., grooves or other predetermined patterns.

In addition to the second alignment marks 212a shaped like holes, another second alignment mark 212b shaped like a protrusion may be formed in the second substrate 212. In addition, a hole 240a may be formed in a heat conduction sheet 240, which may be interposed between the chassis 230 and the second substrate 212, at a position corresponding to the second alignment mark 212b, such that the second alignment mark 212b can be viewed from the outside through the hole 240a.

The disposition and alignment process of the first, second, and third alignment marks 211a, 212a, 212b, 231a and 232a may be substantially similar to that described above for the first embodiment of the present invention. Therefore, a detailed description thereof will not be repeated.

The PDP 210 and the chassis 230 are precisely aligned when the first alignment marks 211a, e.g., protrusions, can be fully viewed through the second alignment mark 212a and the third alignment marks 231a, 232a, which may be holes, while, at the same time, the second alignment mark 212b, e.g., a protrusion, can be fully viewed through the corresponding third alignment marks 231a and 232a and the hole 240a.

The PDP 210 may be aligned with the chassis 230 using an alignment apparatus including an optical sensor (not shown), as described above in the context of the first embodiment. For the alignment operation, the alignment apparatus may be installed behind the chassis 230. Low optical reflectivity of the chassis 230 may be important for precise measurement. In particular, when the optical reflectivity of a region around the third alignment marks 231a and 232a of the chassis 230 is low, measurement errors may be reduced or prevented.

The plasma display module 200 may therefore include coloration units 231b and 232b, which may be produced by coloring the region around the third alignment marks 231a and 232a with a material having low optical reflectivity, or by coloring a portion of the chassis 230 adjacent to the third alignment marks 231a and 232a with a material having low optical reflectivity, in order to reduce the optical reflectivity. If the region around the third alignment marks 231a included in the first chassis unit 231 does not affect the alignment operation, the coloration unit 232b may be formed only in the second chassis unit 232.

Alternatively, the coloration units 231b and 232b may be formed by coloring a region around elements, which are measured and aligned using an optical device, or the elements themselves, using a material having low optical reflectivity.

The coloration units 231b and 232b may be formed of black materials, since black materials generally have low optical reflectivity. Therefore, the coloration units 231b and 232b may be formed by spreading a black material, which may be different from the material of the first and second chassis units 231, 232, on the region around the third alignment marks 231a and 232a, or the coloration units 231b and 232b may be created by forming the first and/or second chassis units 231, 232 of a black material around the third alignment marks 231a and 232a.

Figure 5:
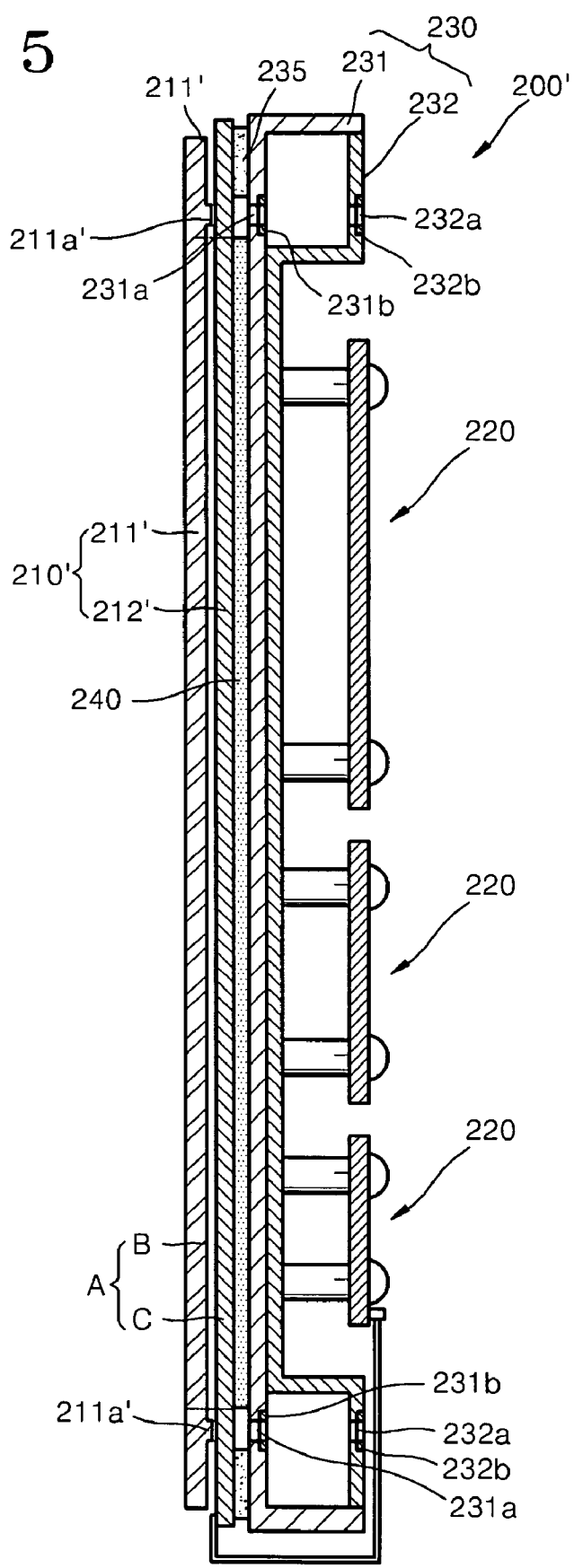
FIG. 5 illustrates a modified version of the plasma display module of FIG. 4.

FIG. 5 illustrates a cross-sectional view of a PDP 200', which is a modified version of the plasma display module 200 of FIG. 4. Referring to FIG. 5, a first substrate 211' of the PDP 210' may include first alignment marks 211a'. In FIG. 5, no separate second alignment marks are formed on a second substrate 212' of the PDP 210'. The first alignment marks may be protrusions. The first alignment marks 211a' may be formed of, e.g., a material such as that used to form bus electrodes. The first alignment marks 211a' may be formed outside a first display region B at the same time the bus electrodes are formed on the first substrate 211'. In this case, the first alignment marks 211a' may have a thickness of about 2 µm to about 8 µm and may have a width of about 30 µm to about 3000 µm. In another implementation, the first alignment marks 211a' may be formed of, e.g., a material such as that used to form a first dielectric layer. The first alignment marks 211a' may be formed outside the first display region B at the same time the first dielectric layer is formed on the first substrate 211'. In this case, the first alignment marks 211a' may have a thickness of about 10 µm to about 40 µm and may have a width of about 60 µm to about 3000 µm. The first alignment marks 211a' may be checked through third alignment marks 231a using, e.g., a camera or the naked eye. The first alignment marks 211a' may be formed of a dark-colored material to prevent reflection.

In another implementation (not shown), second alignment marks may be formed on the second substrate 212' while the first alignment marks 211a' are not formed on the first substrate 211'. The second alignment marks may be protrusions. The second alignment marks may be formed at the same time address electrodes, a second dielectric layer or barrier ribs are formed on the second substrate 212', using the materials used for the address electrodes, the second dielectric layer of the barrier ribs, respectively. When the second alignment marks are formed at the same time the address electrodes are formed on the second substrate 212', the second alignment marks may have a thickness of about 2 µm to about 8 µm and may have a width of about 30 µm to about 3000 µm. When the second alignment marks are formed at the same time the second dielectric layer is formed on the second substrate 212', the second alignment marks may have a thickness of about 7 µm to about 25 µm and may have a width of about 60 µm to about 3000 µm. When the second alignment marks are formed at the same time the barrier ribs are formed on the second substrate 212', the second alignment marks may have a thickness of about 10 µm to about 200 µm and may have a width of about 30 µm to about 3000 µm.

Other materials besides the black material may be used for the coloration units 231b and 232b, as long as they exhibit suitably low optical reflectivity. Therefore, the coloration units 231b and 232b may be formed of a material having a color obtained by mixing black with another color, or they may be formed of the dark-colored material.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display module, comprising;
   a plasma display panel (PDP) including a first substrate and a second substrate and having a PDP alignment mark formed therein; and
   a chassis supporting the PDP and having a chassis alignment mark corresponding to the PDP alignment mark, wherein:
   the PDP includes a first PDP alignment mark formed in the first substrate and a second PDP alignment mark formed in the second substrate, and
   a plurality of second PDP alignment marks is formed on the second substrate, and at least one second PDP alignment mark is formed at a position in the second substrate that does not correspond to a position of a first PDP alignment mark in the first substrate.

2. The plasma display module as claimed in claim 1, wherein:

a display area for displaying an image is formed between the first substrate and the second substrate, one or more PDP alignment marks are formed in the first substrate outside a display area of the PDP, and the at least one second PDP alignment mark is formed in the display area of the PDP.

3. The plasma display module as claimed in claim 2, wherein the PDP includes alignment marks formed adjacent to only two of four corners of the PDP, the two corners being diagonal to each other.

4. The plasma display module as claimed in claim 2, wherein the PDP includes PDP alignment marks formed adjacent to four corners of the PDP.

5. The plasma display module as claimed in claim 1, wherein the first PDP alignment mark is a protrusion and the second PDP alignment mark is a hole.

6. The plasma display module as claimed in claim 1, wherein the second PDP alignment marks are formed at positions corresponding to chassis alignment marks.

7. The plasma display module as claimed in claim 6, wherein the first PDP alignment mark and the chassis alignment mark are holes, the plurality of second PDP alignment marks includes one or more second PDP alignment marks that protrude from two faces of the second substrate, and the one or more protruding second PDP alignment marks are inserted into a corresponding first PDP alignment mark and a corresponding chassis alignment mark.

8. The plasma display module as claimed in claim 7, wherein the corresponding first PDP alignment mark and the corresponding chassis alignment mark are coaxial.

9. The plasma display module as claimed in claim 7, wherein the chassis includes a first chassis unit and a second chassis unit, chassis alignment marks are formed in the first chassis unit and the second chassis unit, and second PDP alignment marks are inserted into the chassis alignment marks in the first chassis unit but are not inserted into the chassis alignment marks in the second chassis unit.

10. The plasma display module as claimed in claim 1, wherein the PDP alignment mark is a hole or a protrusion.

11. The plasma display module as claimed in claim 1, wherein the chassis alignment mark is a hole.

12. The plasma display module as claimed in claim 1, wherein a region around the chassis alignment mark includes a material having low optical reflectivity.

13. The plasma display module as claimed in claim 1, wherein the chassis includes a material having low optical reflectivity.

14. The plasma display module as claimed in claim 1, wherein a region around the chassis alignment mark includes a black material.

15. The plasma display module as claimed in claim 1, wherein the chassis includes a black material.

16. The plasma display module as claimed in claim 1, wherein the at least one second PDP alignment mark is disposed at a rear side of the PDP facing the chassis and overlaps a display area of the PDP.

17. The plasma display module as claimed in claim 16, wherein:

the chassis includes a first chassis unit and a second chassis unit, the first and second chassis units being disposed opposite to and overlapping the display area of the PDP, and the first and second chassis units include respective alignment marks aligned to one another and aligned to the at least one second PDP alignment mark.

18. The plasma display module as claimed in claim 17, wherein the second chassis unit is thicker than the first chassis unit.

* * * * *